United States Patent [19]

Kaplan

[11] 4,383,219
[45] May 10, 1983

[54] NUCLEAR MAGNETIC RESONANCE SPATIAL MAPPING

[75] Inventor: Jerome I. Kaplan, Indianapolis, Ind.

[73] Assignee: Indiana University Foundation, Bloomington, Ind.

[21] Appl. No.: 179,423

[22] Filed: Aug. 19, 1980

[51] Int. Cl.$^3$ .............................................. G01R 33/08
[52] U.S. Cl. ................................... 324/309; 324/311
[58] Field of Search .................... 324/300, 309, 311

[56] References Cited

U.S. PATENT DOCUMENTS

| | | | |
|---|---|---|---|
| 3,474,329 | 10/1969 | Waugh | 324/311 |
| 3,781,650 | 12/1973 | Keller | 324/311 |
| 4,068,161 | 1/1978 | Ernst | 324/311 |
| 4,290,019 | 9/1981 | Hutchison | 324/311 |
| 4,297,637 | 10/1981 | Crooks | 324/309 |

Primary Examiner—Michael J. Tokar
Attorney, Agent, or Firm—Kirkland & Ellis

[57] ABSTRACT

A method for obtaining a spatial mapping using nuclear magnetic resonance. A sample is subjected to time dependent magnetic gradient fields having linear components in the X and Y directions, normalized so that the time dependency is eliminated in the vicinity of a line $X_0, X_0, Z$. A time independent gradient field is applied along this line. An initial RF pulse is applied to rotate the magnetization 180 degrees. This is followed by a 90 degree pulse and then a series of 180 degree pulses. It has been determined experimentally that the relaxation times $T_1$ and $T_2$ for ischemic muscle tissue are longer than $T_1$ and $T_2$ for normal tissue. The above-described pulse pattern enhances the differentiation between the ischemic and normal tissue, and can provide useful data in applications wherein data can only be acquired during a short period of time. The differentiation between the relaxation times in ischemic versus normal tissue increase throughout the period during which measurement is taken, or until the signals become so weak as to indistinguishable from the background noise. The value for the magnetization along the line $X_0$, $Y_0$, Z thus obtained is Fourier transformed to yield a measure of the magnetization (and therefore the degree of ischemia) as a function of Z along the line $X_0$, $Y_0$, Z.

8 Claims, 2 Drawing Figures

180° rotations $M_y(Z_n)$ time $\gamma \beta Z_n = \frac{n\pi}{2t_0}$ for even and odd n $\beta Z = H(Z)$

NUCLEAR MAGNETIC RESONANCE SPATIAL MAPPING

BACKGROUND OF THE INVENTION

1. Field of the Invention

The subject invention pertains to a method of obtaining a spatial mapping of an object utilizing nuclear magnetic resonance (NMR). More particularly, the subject invention relates to a method of differentiating between types of tissue having different relaxation times, such as normal versus ischemic muscle tissue, using NMR. The method is particularly effective where the period during which data can be acquired is brief.

2. Background Art

A variety of techniques for NMR spatial mapping are known in the art. For example, in one technique, resonance absorption is measured in a number of planes, and these data are combined in a manner analogous to that used in computerized axial tomography to yield a three-dimensional representation of the object being studied.

In another technique, resonance at a single point is studied by combining three magnetic fields each of which has a linear gradient and a superimposed sinusoidal time dependent oscillation. The time dependent factor is normalized so that there is no time dependent component to any of the three fields at the point being studied. The sinusoidal variation superimposed on the magnetic field outside of the region being studied will cause the resonance effects of such areas to average out over time. Once the magnetization has been established (assumed to be in the Z direction), a short RF pulse is applied in the X direction which causes the magnetization of the sample to precess into the Y direction (in a rotating reference frame). When the RF field is turned off, the magnetization will precess around the Z axis (in the laboratory frame).

In this technique, a series of 90° RF pulses about the X axis separated by a time constant $T_0$ are applied. The magnetization perpendicular to the static magnetic field will decay at a rate determined by the relaxation time $T_2$, and the magnetization along the Z axis will decay at a rate determined by the relaxation time $T_1$. These alternating pulses continue for a period of time, and eventually a steady state is reached. The magnetization in the XY plane can be detected, and this provides a measure of the presence of protons (i.e., water) in the sample being studied. It should be noted that until the steady state condition is approached, only half the cycles contribute to the acquisition of useful signals. Because of the time necessary to reach the steady state, this technique is not particularly useful for analyses which must be done in a short period of time.

In a variation of this technique, two linear time dependent magnetic field gradients are set up (instead of three), and accordingly the resonance condition is satisfied along a line instead of at a point. A linear time independent gradient field is imposed along the line to be studied. In this manner, the precession frequency along the line being mapped is a function of the field strength along the line. A Fourier analysis of the precessional frequencies provides information as to the relative amplitude of the resonance occurring along the line. Thus, the amount of water present can be measured along the line. However, because this method utilizes a series of 90 degree pulses, the even Fourier components do not provide useful data. Thus, this method provides less than optimal resolution. The apparatus used to carry out the foregoing methods is conventional in design.

It has been found that both the relaxation time $T_1$ and the relaxation time $T_2$ are about 10% longer in ischemic tissue than in normal tissue. However, because the above-described technique yields a result which is proportional to the ratio of $T_2$ to $T_1$ plus $T_2$, ischemic tissue cannot be distinguished. Furthermore, because the above-described technique generally takes on the order of $T_1$ to reach steady state operation, it is not suited to study of tissue such as in vivo heart muscle which is only stationary for on the order of $T_2/5$ seconds.

SUMMARY OF THE INVENTION

The subject invention is a novel method of obtaining a spatial mapping of a sample using nuclear magnetic resonance. The method is designed to enhance differentiation between regions of the sample having different $T_2$ and $T_1$ relaxation times, such as a heart having both normal and ischemic muscle tissue. The method can be used to obtain useful signals during the short sampling times required for in vivo investigation of heart tissue.

A magnetic gradient field is applied to the sample which is time dependent except in a linear region wherein the field is time independent and varies monotonically along its length. This can be accomplished, for example, by providing a sinusoidal perturbation to the X and Y components of the field normalized to cancel out along the line $X_0$, $Y_0$, Z. A monotonic gradient is applied along the line so that the resonance frequency will be a function of position on the line.

An RF pulse is applied to flip the magnetization of the sample 180 degrees from the direction of the magnetic field. An interval $\Delta T$ is allowed to elapse during which any variation in the $T_1$ relaxation time within the sample will begin to manifest itself by a more rapid decrease in magnetization in the portion of the sample having the shorter relaxation time. A 90 degree RF pulse is then applied about the X axis to flip the magnetization of the sample into the plane perpendicular to the direction of the magnetic field. A series of 180 degree pulses separated by an interval $T_0$ are then applied to the sample. Every alternate 180 degree pulse refocuses the magnetization in the Y direction, thereby enhancing the resolution provided by this technique. The difference in magnetization between regions of the sample having different $T_2$ relaxation times continues to grow during this series of pulses until the magnetization becomes so weak as to blend into the background noise. Because the resonance frequency along the line $X_0$, $Y_0$, Z is proportional to the magnetic field strength along the line, a Fourier analysis of the resonance level will provide data as to the magnetization of the sample along the line $X_0$, $Y_0$, Z.

Thus, it is the principal object of the present invention to provide a method for spatial mapping using NMR wherein the difference in magnetization between portions of the sample having different relaxation times can be enhanced.

It is a further object of the present invention to provide a method for differentiating between normal and ischemic tissue using NMR.

Another object of the present invention is to provide a method of obtaining a spatial mapping of in vivo tissue, such as a human heart.

It is still another object of the present invention to provide a method of NMR spatial mapping which is sensitive enough to develop an image of a human heart in the brief period during which the heart is quasi-stationary between beats.

These and other objects of the present invention are hereinafter presented by way of illustration and not limitation by the following detailed description of the preferred embodiment of the present invention.

DETAILED DESCRIPTION OF THE PREFERRED EMBODIMENT

The present invention is a method for spatial mapping using NMR. The method can be carried out on apparatus known in the art such as that described by Waldo Hinshaw in J. Applied Physics Vol. 47 No. 8, pp. 3709-22 (1976).

Nuclear magnetization results from an applied static field $H_0$, which is assumed to be in the Z direction. The nuclear magnetization will align itself with the applied magnetic field. If the magnetization is displaced from the Z direction by an applied radio frequency (RF) field, the magnetization will precess about the Z axis with a frequency (the so-called resonance frequency) given by $$\omega_o = \gamma H_o \tag{1}$$

Since the resonance frequency is directly proportional to the static field strength, the resonance frequency can be made a function of position by varying the static field strength as a function of position.

In the preferred embodiment of the present invention, a time dependent Z directed magnetic gradient field is applied in the form $$k[(x-x_o)\cos at + (y-y_o)\sin at] \tag{2}$$

Figure 2:
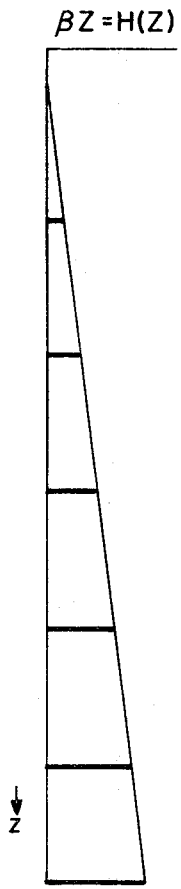
FIG. 2 illustrates the magnitude of the gradient magnetic field as a function of Z.

The time dependent component of the X and Y dependencies will average out over time except on the lines specified by $X_0$, $Y_0$, Z. It is this line which will be mapped. In order to do so, a time independent Z gradient field of the form $$H = k\beta z \tag{3}$$

is provided as illustrated in FIG. 2. Thus, there will be a different resonance frequency for each point along the line $X_0$, $Y_0$, and Z.

As noted above, one application of the method of the subject invention is for differentiation between normal and ischemic muscle tissue in a human heart. It has been found that both $T_1$ and $T_2$ increase by about 10% after the stoppage of blood flow for at least one hour (ischemia). For normal muscle tissue, the value of $T_1$ is about 0.5 seconds and the value of $T_2$ is about 0.06 seconds. As noted above, the prior art "90-90 . . . " methods do not develop significant data until an equilibrium condition is reached (after about 0.5 seconds). Therefore, these prior art methods are not useful for analysis of heart muscle tissue, since the heart is only quiescent for about one-tenth of its period.

In order to enhance the differentiation between normal and ischemic tissue, the first step in the method of the subject invention is to apply a 180 degree RF pulse prior to the period during which measurements are to be made. This pulse will align the nuclear magnetization in the negative Z direction. The magnetization will then begin to decay back to its equilibrium state in accordance with the formula $$M(t) = M_o(1 - 2e^{-t/T_1}). \tag{4}$$

Because $T_1$ is longer in ischemic tissue than in normal tissue, the magnetization will decay more rapidly in the normal tissue. Thus, this initial 180 degree pulse causes enhancement of the difference between the magnetization in normal and ischemic tissue. This difference can be stated as the ratio between the normal magnetization and the ischemic magnetization, given as $$R_{T1} = (1 - 2e^{-\Delta T/T_1 N})/(1 - 2e^{-\Delta T/T_1 I}) \tag{5}$$

It should be noted that the interval $\Delta T$ prior to the quiescent period can be selected to enhance the difference between the magnetization in normal and ischemic tissue. Because this is a method of enhancing the initial difference in magnetization, and no measurements of the resonance level are taken during the interval $\Delta T$, the 180 degree pulse and the associated decay can take place before the quiescent period.

After a time $\Delta T$ (i.e., at the beginning of the quiescent period) a 90 degree pulse is applied to rotate both the normal and ischemic magnetization, $M_n$ and $M_i$ to the Y direction. The spins are then permitted to precess for a time $T_o$ after which a 180 degree pulse is applied. The spins are again permitted to precess for a time T and further 180 degree pulse is applied. This sequence continues for the duration of the quiescent period.

After each time $2T_o$, regardless of the resonance frequency (and therefore the rate of precession) at any point in the sample, all of the magnetization vectors realign themselves in the Y direction. Specifically, for any resonance frequency $\omega_i$, the magnetization will precess through an angle $\omega_i T_o$ in the period $T_o$. The 180 degree pulse at the end of time $T_o$ will change the angle of the magnetization vector to $180° - \omega_i T_o$. During the next period $T_o$, the magnetization will again precess through an angle $\omega_i T$ for a net displacement of $180° - \omega_i T_o + \omega_i T_o = 180°$. The 180 pulse at the end of the second interval $T_o$ will return the magnetization vector to its initial orientation. A more detailed description of this phenomenon appears in an article by Erwin Hahn in Phys. Rev., Vol. 80, page 580 (1950).

The shorter relaxation time $T_2$ in the normal tissue permits the magnetization in the normal tissue to be reduced more rapidly than the magnetization in the ischemic tissue. Thus, differentiation between the magnetization in the normal tissue and the ischemic tissue increases until the magnetization in the healthy tissue blends into the background noise. Since this method does not require an equilibrium condition to be reached before meaningful data is obtained on alternate pulses, the period between each 180 degree pulse produces measurable data during the entire quiescent period of the heart. This data can be accumulated for analysis as described below.

Specifically, during each period $2T_o$ the magnetization will decay by an amount $$e^{-2T_o/T_2} \tag{6}$$

The difference in magnetization between the normal and ischemic tissue will be given as $$R_{T2}=(e^{-2T_o/T2N})/(e^{-2T_o/T2I}) \qquad (7)$$

If the mapping continues for N cycles of $2T_o$ then the difference in magnetization will be given by $$R_{Total}=R_{T1} \times (R_{T2})^n \times (\rho_N/\rho_I) \qquad (8)$$

where the ratio of $\rho_N$ to $\rho_I$ indicates that an additional differentiation arises from edema (the additional concentration of one percent to two percent of water in the ischemic area).

By varying the interval $\Delta T$ (which determines $R_{T1}$), $R_{total}$ can be varied at will. A value of $\Delta T$ can be chosen which will maximize the relative difference in $R_{T1}$; however, this will be at the expense of signal strength since the magnetization in the normal and ischemic regions would be substantially less than for their initial values. Conversely, selecting a shorter interval $\Delta T$ will improve the signal to noise ratio but reduce the differentiation between the normal and ischemic tissue. The interval $\Delta T$ can be selected in each particular application in accordance with the balance between the desired degree of differentiation and signal strength.

Using typical values for heart muscle tissue given above, and assuming a value for $\Delta T$ of 0.1 seconds a 12 percent signal difference between normal and ischemic regions can be obtained. Further differentiation can be obtained at the expense of signal strength as discussed above. In addition, the technique can be extended to obtain a planar rather than a linear mapping by varying $X_0$ or $Y_0$ in equation 2 above.

The total magnetization measured for the line $X_0$, $Y_0$, Z will be given for the period $0-2t_o$ (ignoring the small $T_2$ variation) as $$M_{total}=\Sigma_i M_i e^{i\omega_{oi} t} \qquad (9)$$

where the continuity procedure (described below) has been invoked. The value of the magnetization at point i is obtained as $$M_i = \int e^{-i\omega_{oi} t} M_{total} dt \qquad (10)$$

which is simply the Fourier transformation procedure for finding the magnetization at the point at which the resonance frequency is $\omega_{oi}$. Thus, knowledge of the magnetic field at a point determines the portion of the total magnetization attributable to resonance at that point.

Figure 1:
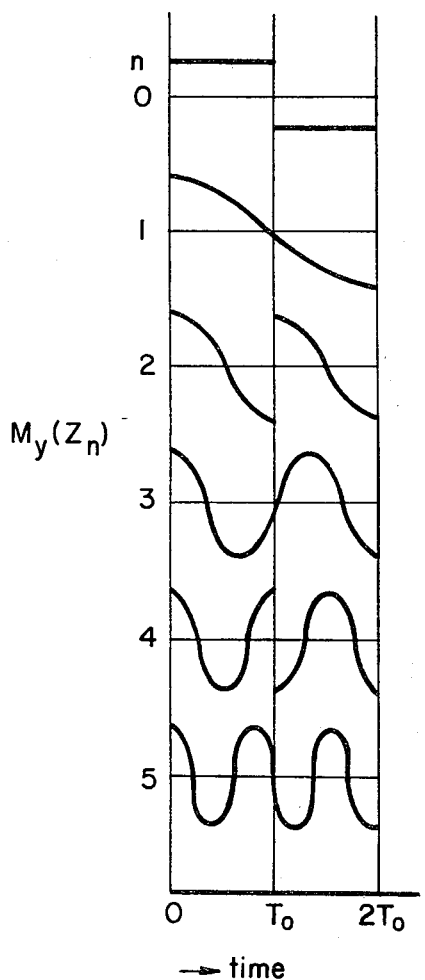
FIG. 1 shows a projection of the magnetization on the Y axis as a function of time for several nodes on the line $X_0$, $Y_0$, Z.

Referring to FIG. 1, the projection of the magnetization on the Y axis is shown for several nodes on the line $X_o$, $Y_o$, Z. It can be seen by inspection that the Y component of the magnetization is discontinuous at time $T_o$ (when the 180 degree pulse is applied) at the first node and at every alternate node thereafter. In order to obtain useful data at these nodes, the projection of the magnetization on the Y axis must be made continuous. It can be seen by inspection of FIG. 1 that this can be accomplished by multiplying the data by $(-1)$ for the interval from $T_o$ to $2T_o$ at the nodes where the discontinuity occurs. The first period $T_o$ and every alternate period $T_o$ thereafter will be referred to as an A period; the second period $T_o$ and every alternate period $T_o$ thereafter will be referred to as a B period. The odd Fourier transformation components are obtained by performing a Fourier transformation on the function specified by the sum of the data acquired during the A periods for the interval 0 to $T_o$, and by the sum of the data acquired during the B periods for the interval from $T_o$ to $2T_o$. The even Fourier transformation components are obtained by performing a Fourier transformation on the function specified by the sum of the data acquired during the A periods for the interval from 0 to $T_o$, and by the negative of the sum of the data acquired during the B periods for the interval for $T_o$ to $2T_o$. The odd Fourier terms thus obtained are also obtainable via the conventional technique described in detail in the discussion of the background art. However the even Fourier terms cannot be evaluated using the method described in the background art since the even modes do not represent repeated behavior necessary for summing the signals for each period of time $T_o$. Accordingly, the method of the subject invention provides twice the mapping resolution of the "90°-90°..." procedure. As described above, the method of the subject invention also provides twice the signal strength of the "90°-90°..." procedure at least for time periods of the order of $T_2$ or less.

While the subject invention as described above is particularly suited for differentiation of normal and ischemic heart muscle tissue, the technique is of general utility for enhancing resolution between materials having small differences in their relaxation times. The foregoing preferred embodiment has been described by way of example and not by way of limitation. The scope of the subject invention is defined and limited only as specified in the following claims.

I claim:

1. A method of obtaining a spatial mapping of a sample utilizing nuclear magnetic resonance comprising:
   generating a magnetic gradient field, which is time dependent, except in a substantially linear region wherein the magnetic field is time independent and varies monotonically with distance along its length, the linear region disposed at least partially within the sample;
   applying an RF pulse to flip the magnetization of the sample 180 degrees from the direction of the magnetic field;
   applying a 90 degree RF pulse to flip the magnetization of the sample into the plane perpendicular to the direction of the magnetic field after an interval $\Delta T$;
   applying at least two RF pulses, each of which flips the magnetization through an angle of 180 degrees and each of which occurs at an interval $T_o$ after the previous RF pulse;
   receiving a signal resulting from the resonance; and
   analyzing the signal to obtain a measure of the RF absorption as a function of the resonance frequency.

2. The method of claim 1 as applied to a sample composed of two substances having different $T_1$ relaxation times wherein $\Delta T$ is selected to optimize the measurable differentiation between the magnetization in the two substances.

3. The method of claim 1 wherein the time independent monotonic field is linear.

4. A method of differentiating between normal and ischemic muscle tissue using nuclear magnetic resonance comprising:
   generting a magnetic gradient field which varies linearly in each of three orthogonal directions, and which has time dependent components in two of the three orthogonal directions, which time dependent components are normalized to zero along a line;

applying an RF pulse to flip the magnetization of the sample 180 degrees from the direction of the magnetic field;

waiting an interval $\Delta T$ to permit differentiation to occur between the magnetization in normal and ischemic tissue;

applying a 90 degree RF pulse to flip the magnetization of the sample into the plane perpendicular to the direction of the magnetic field;

applying at least two RF pulses, each of which flips the magnetization through an angle of 180 degrees, and each of which is applied at an interval $T_o$ after the previous RF pulse;

receiving the signal resulting from the resonance; and performing a Fourier analysis on the signal to determine the degree of magnetization as a function of position along the line.

5. The method of claim 4 wherein the interval $T_o$ is on the order of magnitude of milliseconds.

6. The method of claim 5 wherein the interval $\Delta T$ is on the order of magnitude of 0.1 seconds.

7. The method of claims 4, 5, or 6 as applied to an in vivo heart wherein the first 180 degree pulse is timed so that the period $\Delta T$ will expire approximately at the beginning of the heart's quiescent period.

8. The method of claim 1 as applied to a sample composed of two substances having different T2 relaxation times wherein the interval $\Delta T$ is selected to optimize the measurable differentiation between the magnetization of the two substances.

* * * * *

UNITED STATES PATENT AND TRADEMARK OFFICE
CERTIFICATE OF CORRECTION

PATENT NO. : 4,383,219

DATED : May 10, 1983

INVENTOR(S) : Jerome I. Kaplan

It is certified that error appears in the above—identified patent and that said Letters Patent is hereby corrected as shown below:

In the Abstract, Col. 2, line 4, "$X_0, X_0, Z$" should be --$X_0, Y_0, Z$--.

Col. 3, line 48, "$H=k\beta z$" should be --$H=k\beta z$--.

Signed and Sealed this

Fifth Day of July 1983

[SEAL]

Attest:

GERALD J. MOSSINGHOFF

Attesting Officer    Commissioner of Patents and Trademarks